(12) United States Patent
Kato

(10) Patent No.: US 11,840,058 B2
(45) Date of Patent: *Dec. 12, 2023

(54) PRINTING PARAMETER ACQUISITION DEVICE

(71) Applicant: FUJI CORPORATION, Chiryu (JP)

(72) Inventor: Mitsuaki Kato, Anjo (JP)

(73) Assignee: FUJI CORPORATION, Chiryu (JP)

( * ) Notice: Subject to any disclaimer, the term of this patent is extended or adjusted under 35 U.S.C. 154(b) by 97 days.

This patent is subject to a terminal disclaimer.

(21) Appl. No.: 17/602,079

(22) PCT Filed: Oct. 17, 2019

(86) PCT No.: PCT/JP2019/040871
§ 371 (c)(1),
(2) Date: Oct. 7, 2021

(87) PCT Pub. No.: WO2020/217570
PCT Pub. Date: Oct. 29, 2020

(65) Prior Publication Data
US 2022/0176689 A1    Jun. 9, 2022

(30) Foreign Application Priority Data

Apr. 26, 2019  (WO) .................. PCT/JP2019/018113

(51) Int. Cl.
*B41F 15/08* (2006.01)
*B41F 33/00* (2006.01)
*H05K 3/34* (2006.01)

(52) U.S. Cl.
CPC .......... *B41F 15/0813* (2013.01); *B41F 15/08* (2013.01); *B41F 33/00* (2013.01);
(Continued)

(58) Field of Classification Search
None
See application file for complete search history.

(56) References Cited

U.S. PATENT DOCUMENTS 11,503,753 B2 * 11/2022 Suzuki .................. G06T 7/0004
2002/0014602 A1   2/2002 Holm et al.
(Continued)

FOREIGN PATENT DOCUMENTS

CN          1795099 A    6/2006
EP        3 106 948 A1   12/2016
(Continued)

OTHER PUBLICATIONS

International Search Report dated Nov. 26, 2019 in PCT/JP2019/040871 filed on Oct. 17, 2019, 2 pages)

*Primary Examiner* — Leslie J Evanisko
(74) *Attorney, Agent, or Firm* — Oblon, McClelland, Maier & Neustadt, L.L.P.

(57) ABSTRACT

A printing parameter acquisition device includes an acquisition section and an output section. The acquisition section acquires a printing condition for specifying a member to be used when solder is printed on a board. The output section outputs a printing parameter which is associated with a printing condition corresponding to a printing condition acquired by the acquisition section and of which a reliability is a predetermined level or more, from a database that stores the printing condition, a printing parameter used for controlling driving of a printer, and the reliability of the printing parameter including inspection information on a print state of the solder inspected by a printing inspector in association with each other.

15 Claims, 5 Drawing Sheets

(52) U.S. Cl.
CPC ....... *B41F 33/0009* (2013.01); *H05K 3/3485* (2020.08); *G06F 2218/12* (2023.01)

(56) References Cited

U.S. PATENT DOCUMENTS

2004/0237813 A1    12/2004    Maeda et al.
2015/0050418 A1     2/2015    Greer et al.
2019/0269017 A1*    8/2019    Lee .......................... G06F 30/27

FOREIGN PATENT DOCUMENTS

| JP | 7-32717 A | 2/1995 |
| JP | 9-24665 A | 1/1997 |
| JP | 3818308 B2 | 9/2006 |

\* cited by examiner

Fig. 4

| No. | PRINTING CONDITION | | | PRINTING PARAMETER | | PRODUCTION NUMBER | RELIABILITY | |
|---|---|---|---|---|---|---|---|---|
| | BOARD | SOLDER | MASK | PRINTING SPEED | PRINTING PRESSURE | | NON-DEFECTIVE PRODUCT RATE | DEVIATION |
| 1 | 6A1 | 6B1 | 6C1 | 6D1 | 6E1 | 6F1 | 6G1 | 6H1 |
| 2 | 6A1 | 6B1 | 6C1 | 6D2 | 6E2 | 6F2 | 6G2 | 6H2 |
| 3 | 6A1 | 6B2 | 6C2 | 6D3 | 6E2 | 6F3 | 6G3 | 6H3 |
| 4 | 6A2 | 6B1 | 6C2 | 6D4 | 6E3 | 6F4 | 6G4 | 6H4 |
| .. | .. | .. | .. | .. | .. | .. | .. | .. |

| PRINTING CONDITION OF BOARD | COEFFICIENT OF WEIGHTING | SCORE OF EXAMPLE 1 | | SCORE OF EXAMPLE 2 | |
|---|---|---|---|---|---|
| SIZE | 5 | NON-MATCHING | 0 | MATCHING | 5 |
| THICKNESS | 5 | MATCHING | 5 | MATCHING | 5 |
| MATERIAL | 1 | MATCHING | 1 | NON-MATCHING | 0 |
| RESIST | 1 | MATCHING | 1 | NON-MATCHING | 0 |
| : | : | : | : | : | : |
| MATCHING SCORE | | 7 | | 10 | |

PRINTING PARAMETER ACQUISITION DEVICE

TECHNICAL FIELD

The present description relates to a printing parameter acquisition device.

BACKGROUND ART

In a printing method described in Patent Literature 1, a printing pressure in accordance with a size of a printed circuit board is acquired in advance as back data. Then, the printer automatically calls an optimum printing pressure from board data based on the back data to start printing. In the printing method described in Patent Literature 1, a printing speed and a mask releasing speed corresponding to a type of a metal mask are acquired in advance as the back data. Then, the printer automatically calls the optimum printing speed and mask releasing speed from the type of the metal mask based on the back data, to start printing.

Further, in the printing method described in Patent Literature 1, the printing speed and the mask releasing speed in accordance with a type of cream solder (maker, viscosity, or the like.) are acquired in advance as the back data. Then, the printer automatically calls the optimum printing speed and optimum mask releasing speed from the type of the cream solder based on the back data to start printing. Accordingly, the printing method described in Patent Literature 1 attempts to omit an adjustment of the printing pressure, the printing speed, and the mask releasing speed by an operator at a time of starting the production and at a time of model switching.

A solder printing condition determination method described in Patent Literature 2 determines a printing condition by searching an actual production condition database based on input various information using an actual production condition database in which printing condition data used for production is accumulated and a correlation rule database in which a correlation rule between the printing condition and an influence factor related to the printing condition is accumulated. In addition, in the solder printing condition determination method described in Patent Literature 2, in a case where there is no printing condition matching with the input various information, the actual production condition database is searched sequentially from a target condition having a great influence degree of the condition determination to narrow down candidate printing condition patterns. Accordingly, the solder printing condition determination method described in Patent Literature 2 determines the printing condition matched with the input condition without repeating trial and error in an actual machine to reduce a printing condition tuning operation on the printer.

PATENT LITERATURE

Patent Literature 1: JP-A-7-32717
Patent Literature 2: JP-A-9-24665

BRIEF SUMMARY

Technical Problem

In the above Patent Literatures, inspection information of the printing inspector is not considered. It is common to inspect a print state of solder printed by the printer by the printing inspector. However, the determination of the printing parameter used for controlling driving of the printer by using past inspection information of the printing inspector is not described in any of the Patent Literatures.

In view of such a circumstance, the present description is a printing parameter acquisition device capable of outputting printing parameters used for controlling driving of the printer by using the past inspection information of the printing inspector.

Solution to Problem

The present description discloses a first printing parameter acquisition device including an acquisition section and an output section. The acquisition section acquires a printing condition for specifying a member to be used when solder is printed on a board. The output section outputs, from a database that stores the printing condition, a printing parameter used for controlling driving of a printer, and the reliability of the printing parameter including inspection information on a print state of the solder inspected by a printing inspector in association with each other, the printing parameter which is associated with a printing condition corresponding to the printing condition acquired by the acquisition section and of which the reliability is a predetermined level or more.

In addition, the present description discloses a second printing parameter acquisition device including an acquisition section and an output section. The acquisition section acquires a printing condition for specifying a member to be used when solder is printed on a board. The output section outputs, from a database that stores the printing condition, a printing parameter used for controlling driving of a printer, and a reliability of the printing parameter including inspection information on a print state of the solder inspected by a printing inspector in association with each other, the printing parameter which corresponds to the printing condition acquired by the acquisition section and is associated with the printing condition and the reliability of the printing parameter including the inspection information.

Advantageous Effects

According to the first and second printing parameter acquisition devices, the output section can output the printing parameter from the database that stores the printing condition, the printing parameter, and the reliability of the printing parameter including the inspection information on the print state of the solder inspected by the printing inspector in association with each other. That is, the first and second printing parameter acquisition devices can output the printing parameter used for controlling the driving of the printer by using the past inspection information of the printing inspector.

BRIEF DESCRIPTION OF DRAWINGS

FIG. 4 is a schematic view illustrating an example of data stored in a database.

DESCRIPTION OF EMBODIMENTS

1. Embodiment

1-1. Configuration Example of Printer 1

Figure 1:
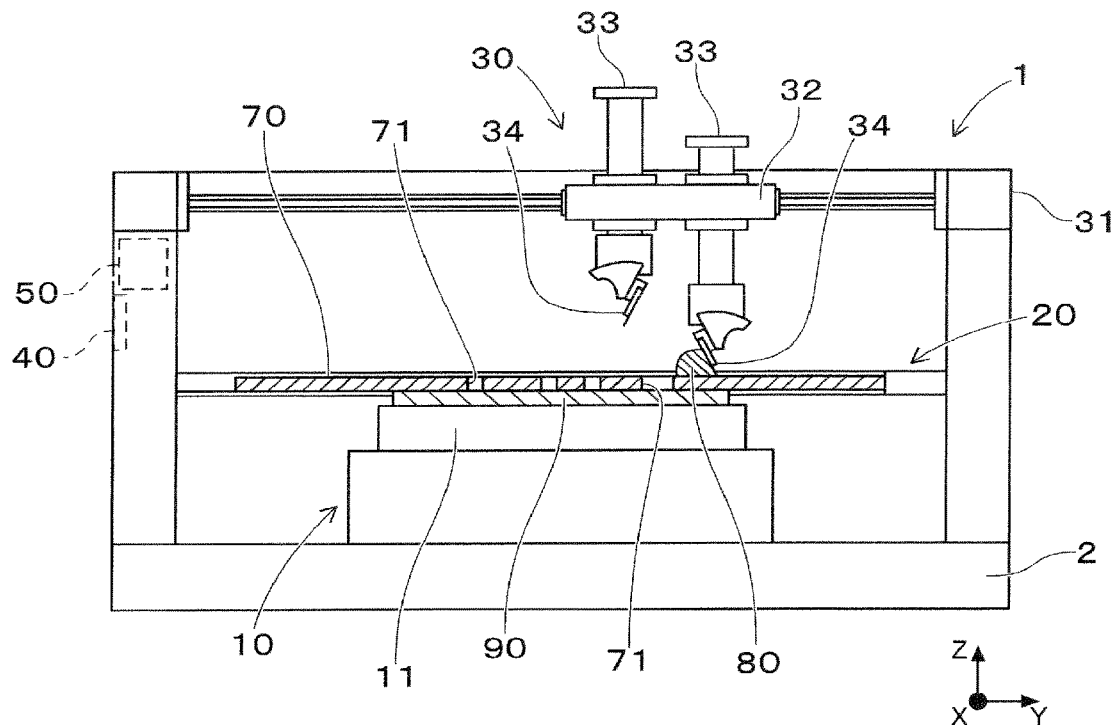
FIG. 1 is a cross-sectional view illustrating a configuration example of a printer.

In printer 1 according to the present embodiment illustrated in FIG. 1, solder 80 is moved along mask 70 by squeegee 34, so that a printing process is performed on board 90. Printer 1 is included in a board working machine that performs a predetermined board work on board 90 to produce a board product. Printer 1 constitutes a board production line together with the board working machine such as printing inspector WM0 illustrated in FIG. 2, a component mounter, a reflow furnace, and an appearance inspector. Printing inspector WM0 inspects a print state of solder 80 printed by printer 1.

As illustrated in FIG. 1, printer 1 includes board conveyance device 10, mask supporting device 20, squeegee moving device 30, display device 40, and control device 50. As illustrated in FIG. 1, a conveyance direction (front-rear direction in FIG. 1) of board 90 is set to X-axis direction, a front-rear direction (left-right direction in FIG. 1) of printer 1 orthogonal to the X-axis is set to Y-axis direction, and a vertical direction (up-down direction in FIG. 1) orthogonal to the X-axis and the Y-axis is set to Z-axis direction.

Board conveyance device 10 conveys a board 90 of a printing target. Board 90 is a circuit board and at least one of an electronic circuit and an electrical circuit is formed. Board conveyance device 10 is provided on base 2 of printer 1. Board conveyance device 10 conveys board 90 disposed on a pallet, for example, by a belt conveyor extending in X-axis direction. Board conveyance device 10 includes board holding section 11 that holds board 90 loaded in printer 1. Board holding section 11 holds board 90 in a state in which an upper surface of board 90 is in close contact with a lower surface of mask 70 at a predetermined position on a lower surface side of mask 70.

Mask supporting device 20 is disposed above board conveyance device 10. Mask supporting device 20 supports mask 70 by a pair of support tables (one support table is illustrated in FIG. 1). The pair of support tables are disposed on a left side and a right side of printer 1 when viewed in a front face direction, and are formed so as to extend along Y-axis direction. It should be noted that FIG. 1 is a partial cross-sectional view of printer 1 taken along Y-axis direction, and schematically illustrates an inside of printer 1 and cross-sections of mask 70 and board 90 as viewed in a side face direction. Opening section 71 extending through mask 70 at a position corresponding to a wiring pattern of board 90 is formed. Mask 70 is supported by mask supporting device 20, for example, via a frame member provided on an outer peripheral edge.

Squeegee moving device 30 lifts and lowers squeegee 34 in a direction (Z-axis direction) perpendicular to mask 70 and moves squeegee 34 in Y-axis direction on the upper surface of mask 70. Squeegee moving device 30 includes head driving device 31, squeegee head 32, a pair of lifting and lowering devices 33 and 33, and a pair of squeegees 34 and 34. Head driving device 31 is disposed at the upper portion of printer 1. Head driving device 31 can move squeegee head 32 in Y-axis direction by, for example, a linear motion mechanism such as a feeding screw mechanism.

Squeegee head 32 is clamped and fixed to a moving body constituting a linear motion mechanism of head driving device 31. Squeegee head 32 holds the pair of lifting and lowering devices 33 and 33. Each of the pair of lifting and lowering devices 33 and 33 holds squeegee 34 and can be driven independently of each other. Each of the pair of lifting and lowering devices 33 and 33 drives, for example, an actuator such as an air cylinder to lift and lower squeegee 34 to be held.

The pair of squeegees 34 and 34 slide on the upper surface of mask 70 to move solder 80 supplied to the upper surface of mask 70 along mask 70. As solder 80, a cream solder (solder paste) can be used. Solder 80 is imprinted on board 90 from opening section 71 of mask 70, so that solder 80 is printed on board 90 disposed on a lower surface side of mask 70. In the present embodiment, each of the pair of squeegees 34 and 34 is a plate-like member formed so as to extend along X-axis direction orthogonal to the printing direction (Y-axis direction).

Squeegee 34 on the front side (left side in FIG. 1) of the pair of squeegees 34 and 34 is used in the printing process for moving solder 80 from the front side to the rear side, and a direction from the front side to the rear side of printer 1 is set as the advancing direction. Rear squeegee 34 (right side in FIG. 1) of the pair of squeegees 34 and 34 is used for printing process to move solder 80 from the rear side to the front side, and the direction from the rear side to the front side of printer 1 is set as an advancing direction. In any of squeegees 34, a direction opposite to the advancing direction is set as a backward direction.

Each of the pair of squeegees 34 and 34 is held by lifting and lowering device 33 such that a front face portion positioned on an advancing side is inclined so as to face below. In other words, each of the pair of squeegees 34 and 34 is held by lifting and lowering device 33 such that a rear face portion positioned on a retreat side is inclined so as to face above. An inclination angle of each of the pair of squeegees 34 and 34 is adjusted by an adjustment mechanism provided at a lower portion of lifting and lowering device 33.

Display device 40 can display an operation status of printer 1. Display device 40 is configured by a touch panel and also functions as an input device for receiving various operations by a user of printer 1.

Control device 50 includes a well-known computing device and a storage device, and a control circuit is configured (any of which is not illustrated). Control device 50 is communicably connected to a management device via a network and can transmit and receive various data. Control device 50 drives and controls board conveyance device 10, mask supporting device 20, squeegee moving device 30, and display device 40 based on a production program, detection results detected by various sensors, or the like.

Figure 2:
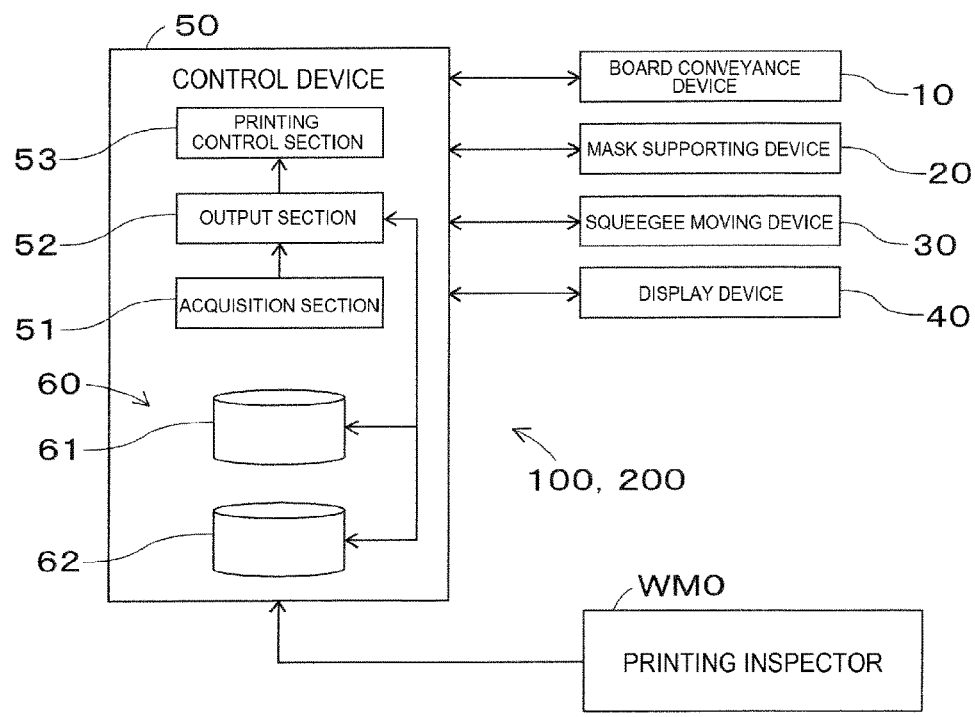
FIG. 2 is a block diagram illustrating an example of control blocks of a first printing parameter acquisition device and a second printing parameter acquisition device.

As illustrated in FIG. 2, when viewed as a control block, control device 50 includes acquisition section 51, output section 52, and printing control section 53. In addition, control device 50 is provided with database 60. The descriptions of acquisition section 51, output section 52, and database 60 will be described later.

Printing control section 53 drives and controls, for example, squeegee moving device 30. In this case, printing control section 53 acquires various information stored in the storage device and detection results of various sensors provided in printer 1. As the storage device, for example, a magnetic storage device such as a hard disk device, a storage device using a semiconductor element such as a flash memory, or the like can be used. The storage device stores a production program or the like for driving printer 1.

Printing control section 53 transmits a control signal to squeegee moving device 30 based on the various types of information and the detection result described above. Therefore, a position in Y-axis direction and a position (height) in Z-axis direction of the pair of squeegees 34 and 34 held by squeegee head 32, as well as the movement speed and the inclination angle are controlled. Then, as described above, the pair of squeegees 34 and 34 are driven and controlled, so that solder 80 is printed on board 90 disposed on the lower surface side of mask 70.

1-2. Configuration Example of First Printing Parameter Acquisition Device 100

Printer 1 of the present embodiment includes first printing parameter acquisition device 100. As illustrated in FIG. 2, first printing parameter acquisition device 100 includes acquisition section 51 and output section 52. Acquisition section 51 acquires printing conditions for specifying a member to be used when solder 80 is printed on board 90. Output section 52 outputs, from database 60, a printing parameter that is associated with the printing condition corresponding to the printing condition acquired by acquisition section 51 and has a reliability having a predetermined level or more.

Figure 3:
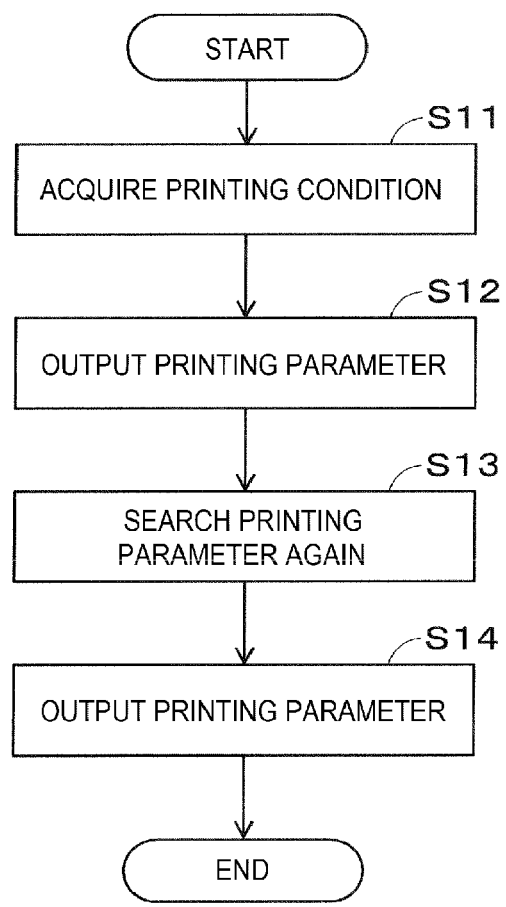
FIG. 3 is a flowchart illustrating an example of a control procedure by the first printing parameter acquisition device and the second printing parameter acquisition device.

First printing parameter acquisition device 100 executes control according to the flowchart illustrated in FIG. 3. Acquisition section 51 performs the process illustrated in step S11. Output section 52 performs the processes illustrated in steps S12 to S14. When the printing parameter is determined and the production program is determined, printing control section 53 executes the printing process. When the printing process is completed, first printing parameter acquisition device 100 updates the reliability of the printing parameter and stores necessary data in database 60.

1-2-1. Configuration Example of Database 60

Database 60 stores the printing condition, the printing parameter used to control the driving of printer 1, and the reliability of the printing parameter including the inspection information on the print state of solder 80 inspected by printing inspector WM0 in association with each other. The printing condition is not limited as long as a member used when solder 80 is printed on board 90 can be specified. The printing condition of the present embodiment specifies at least one of board 90, solder 80, mask 70, and squeegee 34, which are members used when solder 80 is printed on board 90.

For example, a size, a thickness, and a material (including, for example, flexibility, or the like) of board 90, and a thickness of the resist (insulating layer), as well as the product type and use (for example, general consumer equipment, in-vehicle equipment, or the like) of the board product are included in the printing condition for specifying board 90. In addition, for example, a manufacturing maker, a type, a particle diameter, a viscosity, and a thixotropic rate of solder 80 are included in the printing condition for specifying solder 80.

Further, for example, a shape (for example, circular, square, rectangular, or the like) of opening section 71 of mask 70, a size of opening section 71, a thickness of mask 70, a frame size, presence or absence of half etching, and a size of the component to be mounted on board 90 after printing are included in the printing condition for specifying mask 70. For example, a material (for example, metal squeegee, urethane squeegee, or the like) a thickness of squeegee 34 are included in the printing condition for specifying squeegee 34.

The printing parameter may be any parameter as long as it is used to control the driving of printer 1, and is not limited. The printing parameter of the present embodiment is a control parameter for controlling at least one of a printing speed, a printing pressure, a mask releasing speed, a mask releasing distance, a cleaning interval and a cleaning method of mask 70, and an angle of squeegee 34 at the time of printing.

The printing speed refers to a movement speed when squeegee 34 moves in the advancing direction in the printing process. The printing pressure refers to a pressure applied by squeegee 34 to mask 70 in the printing process. The mask releasing speed and the mask releasing distance refer to a speed and a distance (height) when mask 70 is separated from board 90 after the printing process. The cleaning interval and the cleaning method refer to an interval and a method for cleaning mask 70.

For example, the cleaning method includes a dry method, a wet method (for example, a method of coating alcohol or the like for cleaning), and a suction method (a method of suction and cleaning a residue remaining on mask 70). The angle of squeegee 34 refers to an angle of squeegee 34 with respect to mask 70 when squeegee 34 moves in the advancing direction in the printing process.

The reliability of the printing parameter can be represented by, for example, the matching score, the number of production of the board products produced using the printing parameter, a cycle time, or the like. The matching score is a score obtained by multiplying the matching degree between the printing condition acquired by acquisition section 51 and the printing condition stored in database 60 by a coefficient indicating weighting for each printing condition. The cycle time refers to a time period from the time when printer 1 starts the loading of board 90 to the time when solder 80 is printed on board 90 so that board 90 can be unloaded from printer 1 (processing time per sheet of board 90).

The reliability of the printing parameter includes inspection information on the print state of solder 80 inspected by printing inspector WM0. The inspection information includes, for example, a non-defective product rate and deviation information. The non-defective product rate is a ratio of non-defective products when multiple board products are produced using printing parameters. As for the deviation information, a deviation with respect to a target value for each of the volume, the area, and the height of solder 80 printed on board 90 is collected for multiple printing regions PA0 in board 90 and the printing process of multiple boards 90. The reliability of the printing parameter is described in detail in the description of output section 52.

FIG. 4 schematically illustrates a state in which the printing condition, the printing parameter, and the reliability of the printing parameter are stored in database 60 in association with each other. No. 1 indicates that the printing condition for specifying board 90 indicated by data 6A1, the printing condition for specifying solder 80 indicated by data 6B1, and the printing condition for specifying mask 70 indicated by data 6C1 are stored in database 60 in association with each other. No. 1 indicates that the printing parameter for controlling the printing speed indicated by data 6D1 and the printing parameter for controlling the printing pressure indicated by data 6E1 are stored in database 60 in association with each other.

In addition, No. 1 indicates that the reliability of the printing parameter represented by the number of production of the board products indicated by data 6F1, the reliability of the printing parameter represented by the non-defective product rate indicated by data 6G1, and the reliability of the printing parameter represented by the deviation indicated by data 6H1 are associated with each other and stored in database 60. No. 1 indicates that the printing condition, the printing parameter, and the reliability of the printing parameter are stored in database 60 in association with each other.

For convenience of illustration, some of the printing conditions, the printing parameters, and the reliability of the printing parameters are schematically illustrated in the drawing. For example, the printing condition for specifying board 90 is stored for each of the above-described multiple indices (for example, the size, the thickness, and the material of board 90, and the thickness of the resist, as well as the quality and application of the board product, or the like). The above description can be similarly applied to the other printing conditions. Database 60 can also store the other printing conditions, the printing parameters, and the reliability of the printing parameter described above. In addition, the above description can be similarly applied to No. 2 and subsequent data.

As illustrated in FIG. 2, database 60 of the present embodiment includes first database 61 and second database 62. First database 61 is provided by a manufacturer of printer 1. First database 61 mainly stores data to be used at an initial stage of the introduction of printer 1. In order to derive an appropriate printing parameter from the printing condition, there are many cases that experience and print performance of an engineer specializing in printing are necessary. Therefore, first database 61 may store data (printing conditions, printing parameters, and reliability of the printing parameters) created based on the experience and the print performance of the engineer specializing in printing on the side of the manufacturer of printer 1.

Second database 62 stores the printing conditions, the printing parameters, and the reliability of the printing parameters used when the user of printer 1 produces the board product using printer 1 in association with each other. That is, second database 62 stores data associated with the board product produced by the user of printer 1. Therefore, the more the user of printer 1 produces the board product, the more the data is accumulated, so that the printing parameter matching the board product produced by the user of printer 1 can be easily obtained. By causing the engineer on a user side of printer 1 to adjust the printing parameter based on the production result of the board product, it is possible to expect that the reliability of the printing parameter is improved.

In addition, when at least a part of the printing parameters included in the production program for driving printer 1 is changed, database 60 can store the printing condition, the changed printing parameter, and the reliability of the changed printing parameter in a newly created file in new association with each other. Therefore, database 60 can store the printing condition, the changed printing parameter, and the reliability of the changed printing parameter when at least a part of the printing parameters included in the production program is changed in appropriate association with each other.

For example, the data of No. 1 illustrated in FIG. 4, it is assumed that the printing parameter for controlling the printing speed indicated by data 6D1 is changed. In this case, database 60 does not update the data of No. 1, creates a new file, and stores the printing condition, the changed printing parameter, and the reliability of the changed printing parameter in association with each other. Database 60 secures storage regions (storage regions after No. 4 in which no data is stored) separate from the data of No. 1 and stores the printing condition, the changed printing parameter, and the reliability of the changed printing parameter in association with each other. Database 60 in this case may be the target of first database 61, but may be the target of second database 62 in many cases. First database 61 and second database 62 may be constructed to have the same data structure. In addition, database 60 may be normalized.

1-2-2. Acquisition Section 51

Figure 5A:
FIG. 5A is a schematic view illustrating an example of an input screen.

Acquisition section 51 acquires a printing condition for specifying a member to be used when solder 80 is printed on board 90 (step S11 illustrated in FIG. 3). Acquisition section 51 can acquire the printing condition, for example, using an input screen illustrated in FIG. 5A. The input screen is displayed, for example, on display device 40 illustrated in FIGS. 1 and 2.

The user of printer 1 can cause display device 40 to display an operation phase by operating operation sections BP11, BP21, BP31, and BP41 surrounded by dashed line BL1. When the user operates operation section BP11, display device 40 displays an operation in a creation stage of a production program. When the user operates operation section BP21, display device 40 displays an operation in a production stage. When the user operates operation section BP31, display device 40 displays an operation in a clearing stage. When the user operates operation section BP41, display device 40 displays an operation in an error generation stage.

In addition, after selecting the operation phase, the user of printer 1 can select or input the operation in each operation phase by sequentially operating the operation sections surrounded by dashed line BL2 (in this drawing, operation sections BP12 to BP18 are illustrated). Display device 40 can also display an operation status in each operation phase. For example, when the user operates operation section BP14, selection or input of the printing conditions is enabled.

In this drawing, a state in which product type US1 of the board product is inputted is illustrated. In addition, in this drawing, a state in which thickness MT1 of mask 70 and size MS1 of opening section 71 are inputted and the shape (for example, square) of opening section 71 is selected is illustrated. Further, in this drawing, a state in which maker MF1 and type MD1 of solder 80 are selected, and particle diameter PS1, thixotropic rate TH1, and viscosity VC1 of solder 80 stored in advance are automatically inputted is illustrated. When the user operates operation section BP51, the user can directly input particle diameter PS1, thixotropic rate TH1, and viscosity VC1 of solder 80. In addition, in this drawing, a state in which type SK1 of squeegee 34 is inputted is illustrated. The above description can be similarly applied to the input of other printing conditions.

1-2-3. Output Section 52

Figure 5B:
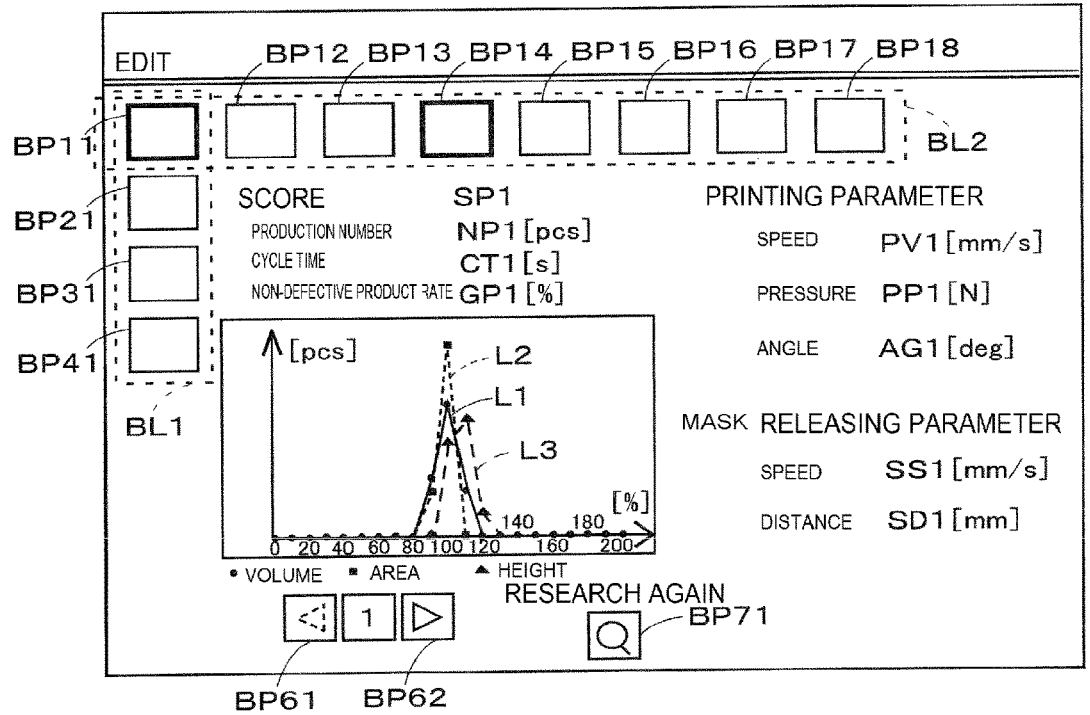
FIG. 5B is a schematic view illustrating an example of an output screen.

Output section 52 outputs, from database 60, a printing parameter associated with the printing condition corresponding to the printing condition acquired by acquisition section 51 and having a reliability of a predetermined level or more (step S12 illustrated in FIG. 3). In the present embodiment, when acquisition section 51 acquires the printing condition and the user operates operation section BP52 of the input screen illustrated in FIG. 5A, the printing parameter is searched for and, for example, an output screen illustrated in FIG. 5B is displayed.

Output section 52 can score the degree of matching between the printing condition acquired by acquisition section 51 and the printing condition stored in database 60 by multiplying the matching degree by a coefficient indicating weighting for each printing condition. Then, output section 52 can determine that the higher the matching score indicating the matching degree, the more the printing condition acquired by acquisition section 51 corresponds to the printing condition stored in database 60.

For example, the larger the size of board 90 and the thinner the thickness of board 90, the more a deflection amount of board 90 is easily increased. In the printing process, in a case in which the deflection amount of board 90 is emphasized, for example, the coefficient indicating the weighting of the printing condition for specifying the size and the thickness of board 90 may be increased as compared with other printing conditions.

Figures 6, 7:
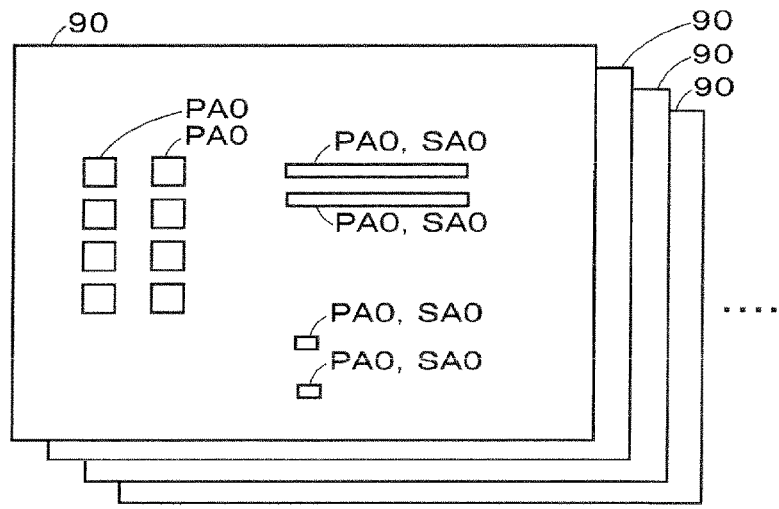
FIG. 6 is a schematic view illustrating an example of a method of calculating the matching score.
FIG. 7 is a schematic view illustrating an example of a printing region and a designation region.

FIG. 6 illustrates an example of a method of calculating the matching score at this time. The coefficients of the size and the thickness of board 90 are set to 5 (5 times when matched), and the other coefficients are set to 1 (1 times when matched). The printing condition of Example 1 stored in database 60 has a larger number of matching printing conditions than the printing conditions of Example 2. However, a total score (matching score) in Example 1 multiplied by the above coefficient is 7 points, which is smaller than a total score (10 points) in Example 2. Accordingly, in the above weighting, it is determined that the printing condition of the example 2 stored in database 60 corresponds to the printing condition acquired by acquisition section 51, as compared with the printing condition of the example 1.

As described above, the correspondence degree of the printing condition changes depending on the magnitude of the coefficient indicating the weighting. Accordingly, the coefficient indicating the weighting of the printing condition may be determined, for example, based on the experience and the printing performance of the engineer specializing in printing on the side of the manufacturer of printer 1. The engineer determines the coefficient in consideration of the influence degree described above. The coefficient indicating the weighting of the printing condition may be a fixed value and, for example, may be a variable value that can be changed for each type of board product.

In addition, acquisition section 51 may receive a change of a coefficient by the user of printer 1. Acquisition section 51 can receive the change of the coefficient by the user of printer 1, for example, using the input screen illustrated in FIG. 5A. In this case, for example, the engineer on the user side of printer 1 can adjust the coefficient indicating the weighting of the printing condition based on the printing performance. Therefore, the above-mentioned coefficient suitable for the board product produced by the user of printer 1 can be easily set.

As the matching score is higher, the printing condition acquired by acquisition section 51 corresponds to the printing condition stored in database 60. Accordingly, it can be said that the printing parameter associated with the printing condition (printing condition having a high correspondence degree) having a high matching score makes it easier to reproduce the production status of the board product in the past, and the reliability of using the printing parameter is high. That is, the reliability of the printing parameter can be indicated by the matching score. In this case, output section 52 outputs a printing parameter (corresponding to a printing parameter of which the reliability is a predetermined level or more) of which the matching score is a predetermined score or more. In addition, output section 52 can output the printing parameters in descending order of the matching score.

For example, it is assumed that acquisition section 51 acquires the printing condition for specifying board 90 indicated by data 6A1 in FIG. 4, the printing condition for specifying solder 80 indicated by data 6B2, and the printing condition for specifying mask 70 indicated by data 6C2. In this case, output section 52 outputs the printing parameter (printing parameter for controlling the printing speed indicated by data 6D3 and printing parameter for controlling the printing pressure indicated by data 6E2) having the highest matching score.

FIG. 5B illustrates an example of the output of the printing parameter. In this drawing, a state is illustrated in which printing speed PV1, printing pressure PP1, angle AG1 of squeegee 34, mask releasing speed SS1, and mask releasing distance SD1 are outputted from among the printing parameters having the highest matching score. Printing speed PV1 illustrated in FIG. 5B corresponds to the printing parameter for controlling the printing speed indicated by data 6D3 in FIG. 4. Printing pressure PP1 illustrated in FIG. 5B corresponds to the printing parameter for controlling the printing pressure illustrated in data 6E2 in FIG. 4. In FIG. 4, descriptions of other printing parameters such as the angle of squeegee 34 are omitted.

Output section 52 can output other printing parameters in the same manner. In addition, in this drawing, the type of the printing parameter is illustrated only by character information, such as "speed", for example, but the type of the printing parameter may be visually displayed by an icon or the like. Further, each time the user operates operation section BP61, a printing parameter having a higher matching score than that of the displayed printing parameter is output. In this drawing, a state is illustrated in which the printing parameter having the highest matching score is output, so that the user cannot operate operation section BP61. Conversely, each time the user operates operation section BP62, a printing parameter having a lower matching score than that of the displayed printing parameter is output. In addition, output section 52 can also display a list of printing parameters.

In the present embodiment, the reliability of the printing parameter includes inspection information on the print state of solder 80 inspected by printing inspector WM0. The inspection information is acquired each time printer 1 performs the printing process (printing of solder 80) and printing inspector WM0 inspects the print state of solder 80. Specifically, when performing the printing process, printer 1 reads an identification code provided on board 90 to obtain board identification information. Printer 1 performs the printing process and stores the board identification information, the printing condition, and the printing parameter used in the printing process in association with each other.

When performing the inspection process, printing inspector WM0 reads an identification code provided on board 90 to acquire the board identification information. Printing inspector WM0 inspects the print state of solder 80 and stores the board identification information and the inspection information in association with each other. For example, printing inspector WM0 sets a reference range for determining that each of the volume, the area, and the height of solder 80 printed on board 90 as a non-defective product. Then, printing inspector WM0 determines that board 90 is a non-defective product when all of the volume, the area, and the height of solder 80 in all of printing regions PA0 of board 90 (12 locations in this drawing) illustrated in FIG. 7 fall within reference ranges. Conversely, printing inspector WM0 determines board 90 as a defective product when at least one of the volume, the area, and the height of solder 80 in at least one printing region PA0 of board 90 deviates from the reference range.

The inspection information includes, for example, a non-defective product rate and deviation information. The non-defective product rate is a ratio of non-defective products when multiple board products are produced using printing parameters. The non-defective product rate can be calculated from an inspection result (determination result of the non-defective product or the defective product described above) of printing inspector WM0. After board 90 is determined to be a defective product by printing inspector WM0, in a case in which board 90 is determined to be a non-defective product by inspection by an operator, board 90 can also be treated as a non-defective product.

Even if all of the volume, the area, and the height of solder 80 fall within the reference range, the print quality is likely to deteriorate as the variation in multiple printing regions PA0 of board 90 increases. For example, the smaller the area of printed solder 80 with respect to the target value, the easier solder 80 is chipped. Conversely, the larger the area of printed solder 80 with respect to the target value, the easier solder 80 bleeds. In addition, the lower the height of printed solder 80 with respect to the target value, the easier solder 80 is faint. Conversely, the higher the height of printed solder 80 with respect to the target value, the easier solder 80 has a shape like a horn. The above description can be similarly applied to a case in which the variation is increased in the printing process of multiple boards 90. As described above, the reliability of the printing parameter can be represented by the deviation with respect to the target value for each of the volume, the area, and the height of solder 80 printed on board 90.

As for the deviation information, a deviation with respect to a target value for each of the volume, the area, and the height of solder 80 printed on board 90 is collected for multiple printing regions PA0 in board 90 and the printing process of multiple boards 90. The target value of the volume of solder 80 can be represented by a multiplication value obtained by multiplying the area of opening section 71 of mask 70 by the thickness of mask 70. The target value of the area of solder 80 can be represented by the area of opening section 71 of mask 70. The target value of the height of solder 80 can be represented by the thickness of mask 70.

For example, it is assumed a case in which multiple boards 90 (for example, 1000 boards) illustrated in FIG. 7 are produced. In this case, in the deviation information, the deviation with respect to the target value for multiple (12 locations in this drawing) printing regions PA0 on one board 90 is collected and the deviation with respect to the target value for the printing process of multiple (1000) boards 90 is collected. The deviation with respect to the target value is collected for each of the volume, the area, and the height of solder 80. Accordingly, the deviation information includes 36,000 (=12×1000×3) pieces of information.

First printing parameter acquisition device 100 acquires, from printer 1, the board identification information, the printing condition, and the printing parameter used in the printing process. First printing parameter acquisition device 100 communicates with printing inspector WM0 to acquire the board identification information and the inspection information. First printing parameter acquisition device 100 can cause the printing condition and the printing parameter to correspond to the inspection information based on the board identification information, and can cause database 60 to store the printing condition, the printing parameter, and the inspection information in association with each other. As described above, first printing parameter acquisition device 100 cooperates with printing inspector WM0 such that the operator does not need to input the inspection information.

The reliability of the printing parameter can be represented by, for example, the number of production of the board products produced by using the printing parameter, the cycle time, or the like. First printing parameter acquisition device 100 can acquire, from printer 1, the printing condition, the printing parameter, and the reliability of the printing parameter (production number of the board products, cycle time, or the like), and store those in database 60 in association with each other. In this manner, the printing condition, the printing parameter, and the reliability of the printing parameter including the inspection information are stored in database 60 in association with each other. Accordingly, first printing parameter acquisition device 100 can output an appropriate printing parameter using the past inspection information of printing inspector WM0 without actually printing solder 80 on board 90.

As illustrated in FIG. 5B, output section 52 can classify the deviation with respect to the target value into multiple classes for each of the volume, the area, and the height of solder 80, and output the frequency-relevant information obtained by aggregating the frequency of occurrence of the deviation information belonging to each class. A horizontal axis in this drawing represents the deviation with respect to the target value and represents the target value (100%) when the deviation is zero. In this drawing, for example, a class width is set to 10%, and the horizontal axis is divided into 20 classes ranging from 0% to 200%, but the class width and the number of classes are not limited. In addition, a vertical axis in this drawing represents the frequency of occurrence of the deviation information. Polygonal line L1 represents the frequency of occurrence of the deviation information on the volume of solder 80. Polygonal line L2 represents the frequency of occurrence of the deviation information on the area of solder 80. Polygonal line L3 represents the frequency of occurrence of the deviation information on the height of solder 80.

The frequency-relevant information may be frequency distribution data in which the frequency of occurrence of the deviation information is recorded for each class, or may be a frequency distribution or a relative frequency distribution created based on the frequency distribution data. The frequency distribution data is obtained by recording a combination of a class and the frequency of occurrence of deviation information belonging to the class, and can be represented by, for example, a table, an arrangement, or the like.

In the frequency distribution data of the present embodiment, the class of 0% to 10%, the frequency of occurrence of the deviation information on the volume of solder 80 belonging to the class, the frequency of occurrence of deviation information on the area of solder 80 belonging to the class, and the frequency of occurrence of deviation information on the height of solder 80 belonging to the class are recorded. The above description can be similarly applied to classes from 10% to 20%, as well as to subsequent classes. In addition, in the frequency distribution data, the maximum value, the minimum value, the representative value (for example, average value and maximum frequency value), the variation, and the like for each of the volume, the area, and the height of solder 80 can be recorded. The variation can be represented, for example, by using an integer multiple (for example, triple) of a standard deviation.

In addition, in the frequency distribution data, the cycle time, the non-defective product rate, and the like can be recorded. The above description can be similarly applied to an aspect in which output section 52 outputs the printing parameter and the frequency-relevant information based on deviation information on designation region SA0 which is described later. In this case, the frequency of occurrence of the deviation information on designation region SA0 is recorded in the frequency distribution data.

As illustrated in FIG. 5B, the frequency distribution is a graph of the frequency distribution data, and can be represented by, for example, a histogram (bar graph, polygonal lines L1, L2, L3, curve, or the like). The curve is a graph in which the frequency of occurrence of the deviation information belonging to each class are connected by smooth curves. The relative frequency distribution is a graph in which the frequency of occurrence of the deviation information of each class is divided by the total number of deviation information, and can be represented by a histogram (bar graph, polygonal line, curve, or the like). According to such a graph, the user can easily grasp the tendency of the frequency of occurrence of the deviation information.

For example, the user may adopt, as the printing parameter used for production, the printing parameter of which the frequency distribution or the relative frequency distribution is closer to the normal distribution. In addition, the user may adopt, as the printing parameter used for production, the printing parameter having a smaller variation in the frequency distribution or the relative frequency distribution. Further, the user may adopt, as the printing parameter to be used for production, the representative value (for example, the average value and the maximum frequency value) of the frequency distribution or the relative frequency distribution closer to the target value (100%).

In addition, acquisition section 51 can acquire designation region SA0, which is predetermined printing region PA0 among multiple printing regions PA0 on board 90. Designation region SA0 can be arbitrarily designated. In the present embodiment, designation region SA0 is designated by the user selecting desired opening section 71 from multiple opening sections 71 of mask 70 on the input screen illustrated in FIG. 5A. Therefore, acquisition section 51 can acquire designation region SA0 designated by the user.

For example, printing region PA0 determined to be in a bad print state by printing inspector WM0 has a higher possibility that the printing quality is deteriorated as compared with printing region PA0 determined to be in a good print state, and can be said to be printing region PA0 that is of high interest to the user. As illustrated in FIG. 7, for example, the smaller the area of printing region PA0, the more the print quality is likely to be deteriorated. Further, for example, the more printing region PA0 has a unique shape (for example, elongated shape), the more the print quality is likely to be deteriorated. Accordingly, designation region SA0 may be printing region PA0 determined by printing inspector WM0 to be in the bad print state, or printing region PA0 designated in consideration of at least one of the area and the shape of printing region PA0.

In this embodiment, output section 52 outputs the printing parameter and the frequency-relevant information based on the deviation information on designation region SA0 acquired by acquisition section 51. Specifically, output section 52 outputs the frequency-relevant information obtained by aggregating the frequency of occurrence of the deviation information collected for designation region SA0. For example, it is assumed a case in which multiple boards 90 (for example, 1000 boards) illustrated in FIG. 7 are produced. In this case, in the deviation information, the deviation with respect to the target value for multiple (four in this drawing) designation regions SA0 in one board 90 is collected, and the deviation with respect to the target value for the printing process of multiple (1000) boards 90 is collected. The deviation with respect to the target value is collected for each of the volume, the area, and the height of solder 80. Accordingly, the deviation information includes 12,000 (=4×1000×3) pieces of information. Also in this case, output section 52 can output the printing parameter and the frequency-relevant information in the same manner as the aspect illustrated in FIG. 5B.

In a case in which a desired printing parameter (for example, a printing parameter of which the frequency distribution or the relative frequency distribution is close to the normal distribution) is not found, the user may operate operation section BP71 of the output screen illustrated in FIG. 5B. Therefore, the printing parameter can be searched again (step S13 illustrated in FIG. 3). As described below, output section 52 narrows down candidates of the printing parameters and outputs the narrowed-down printing parameters (step S14).

It can be said that the larger the number of production of the board products produced by using the printing parameter, the higher the production record by using the printing parameter is. Accordingly, it can be said that the higher the number of production of the board products of the printing parameter, the higher the reliability of using the printing parameter is. That is, the reliability of the printing parameter can be represented by the number of production of the board products produced by using the printing parameter. In this case, output section 52 outputs a printing parameter (corresponding to a printing parameter of which the reliability is a predetermined level or more) in which the number of production of the board products is a predetermined number or more.

In addition, the shorter the cycle time, the easier the production time of the board product is shortened. For example, as the printing parameter for which the printing speed is set to be high, the cycle time is likely to be shortened, so that the production time of the board product is likely to be shortened. Accordingly, in a case in which it is desired to preferentially output the printing parameter for the production time of the board product, it can be said that as the printing parameter for which the cycle time is shorter, the reliability of using the printing parameter is higher. That is, the reliability of the printing parameter can be represented by the cycle time. In this case, output section 52 outputs a printing parameter (corresponding to a printing parameter of which the reliability is a predetermined level or more) of which the cycle time is a predetermined time or less.

Further, it can be said that the higher the non-defective product rate (closer to 100%) of the printing parameter, the higher the reliability of using the printing parameter is. That is, the reliability of the printing parameter can be represented by the non-defective product rate. In this case, output section 52 outputs a printing parameter (corresponding to a printing parameter of which the reliability is a predetermined level or more) having a non-defective product rate of a predetermined ratio or more.

As described above, the reliability of the printing parameter can be represented by the deviation with respect to the target value for each of the volume, the area, and the height of solder 80 printed on board 90. In this case, output section 52 outputs a printing parameter of which the deviation is a predetermined value or less (corresponding to a printing parameter of which the reliability is a predetermined level or more).

The reliability of the printing parameter can be represented by multiple indices described above. That is, the reliability of the printing parameter can be represented by at least one of the matching score, the number of production of the board products produced by using the printing parameter, the cycle time, the non-defective product rate, and the deviation with respect to the target value for each of the volume, the area, and the height of solder 80 printed on board 90. In addition, output section 52 can output the printing parameters in the order from a printing parameter having good multiple indices. For example, output section 52 can output the printing parameters in the order from a printing parameter having the highest matching score and the highest production number of the board products. The above description can be similarly applied to other combinations of multiple indices.

In addition, output section 52 can output the printing parameters in the order of higher reliability (higher matching score) with respect to a predetermined index (for example, matching score) indicating the reliability of the printing parameter, and then sort the printing parameters in the order of higher reliability (higher the number of production) with respect to other indices (for example, the number of production of board products). Switching of the output of the printing parameter is executed, for example, by a user of printer 1 operating a predetermined operation section of the output screen. In addition, it is also possible to set the priority for multiple indices indicating the reliability of the printing parameter. In this case, the printing parameters are sorted in descending order of the reliability from the index having the highest priority.

As described above, when the printing parameter is determined and the production program is determined, printing control section 53 executes the printing process. When the printing process is completed, first printing parameter acquisition device 100 updates the reliability of the printing parameter and stores necessary data in database 60. Specifically, first printing parameter acquisition device 100 receives, for example, the reliability (for example, the non-defective product rate) of the printing parameter from printing inspector WM0, and second database 62 stores the printing condition, the printing parameter, and the received reliability (in this case, the non-defective product rate) of the printing parameter in association with each other.

In addition, first printing parameter acquisition device 100 may, for example, receive an inspection result (for example, good or bad quality of each of multiple board products) from printing inspector WM0, and may create the reliability (in this case, the non-defective product rate) of the printing parameter based on the received inspection result. In this case, second database 62 stores the printing condition, the printing parameter, and the created reliability (in this case, the non-defective product rate) of the printing parameter in association with each other.

The above-described storage step of the data is performed when the printing parameter included in the production program is not changed. The storage step of the above-described data is performed on the printing parameter before the change and the reliability of the printing parameter before the change when at least a part of the printing parameters included in the production program is changed. As described above, database 60 can store the printing condition, the changed printing parameter, and the reliability of the changed printing parameter in the newly created file in new association with each other when at least a part of the printing parameters included in the production program is changed.

1-3. Configuration Example of Second Printing Parameter Acquisition Device 200

Printer 1 may also include second printing parameter acquisition device 200. As illustrated in FIG. 2, second printing parameter acquisition device 200 includes an acquisition section 51 and output section 52, similarly to first printing parameter acquisition device 100. However, output section 52 of second printing parameter acquisition device 200 outputs the printing parameter associated with the printing condition corresponding to the printing condition acquired by acquisition section 51 and the reliability of the printing parameter including the inspection information from database 60. Database 60 stores the printing condition, the printing parameter used to control the driving of printer 1, and the reliability of the printing parameter including the inspection information on the print state of solder 80 inspected by printing inspector WM0 in association with each other.

In addition, output section 52 of second printing parameter acquisition device 200 may output the printing parameter having the reliability of the predetermined level or more, similarly to that of first printing parameter acquisition device 100. Except for the point that output section 52 outputs the printing parameter and the reliability of the printing parameter including the inspection information from database 60, it is the same as the first printing parameter acquisition device 100, and duplicate descriptions thereof will be omitted in the present specification.

Output section 52 of second printing parameter acquisition device 200 can output the printing parameter and the reliability of the printing parameter including the inspection information, for example, by using the output screen illustrated in FIG. 5B. For example, as illustrated in FIG. 5B, output section 52 can output the number of production NP1 of the produced board products, cycle time CT 1, and non-defective product rate GP1. Output section 52 can also output quality score SP1. Quality score SP1 is set so as to be better as production number NP1 of the produced board products is larger (upper limit value may be provided), and as the non-defective product rate is closer to 100%. Quality score SP1 is set so as to be better as the representative values (for example, average value and maximum frequency value) of the frequency distribution data for each of the volume, the area, and the height of solder 80 are closer to 100%. Further, quality score SP1 is set so as to be better as the variation in the frequency distribution data for each of the volume, the area, and the height of solder 80 is smaller.

2. Others

Although first and second printing parameter acquisition devices 100 and 200 according to the embodiment are provided in control device 50 of printer 1, they may be provided outside printer 1. First and second printing parameter acquisition devices 100 and 200 may be provided, for example, in a management device that manages a board production line. First and second printing parameter acquisition devices 100 and 200 may be provided, for example, on a cloud.

In addition, printer 1 is not limited to the aspect using squeegee 34 and mask 70. Printer 1 may have an aspect in which solders 80 are sequentially coated to each of multiple printing positions of board 90 by using a printing head. In this case, the printing condition specifies at least one of board 90 and solder 80. The printing parameter is a control parameter when at least one of the printing speed and the printing pressure is controlled.

3. Printing Parameter Acquiring Method

The descriptions with respect to first and second printing parameter acquisition devices 100 and 200 can be similarly applied to a printing parameter acquiring method. Specifically, the printing parameter acquiring method includes an acquiring step and an outputting step. The acquiring step corresponds to control performed by acquisition section 51. The outputting step corresponds to the control performed by output section 52. The control performed by output section 52 may be control (first printing parameter acquiring method) performed by output section 52 of first printing parameter acquisition device 100, or may be control (second printing parameter acquiring method) performed by output section 52 of second printing parameter acquisition device 200.

4. Example of Effects of Embodiment

With first and second printing parameter acquisition devices 100 and 200, output section 52 can output the printing parameter from database 60 in which the printing condition, the printing parameter, and the reliability of the printing parameter including the inspection information on the print state of solder 80 inspected by printing inspector WM0 are stored in association with each other. That is, first and second printing parameter acquisition devices 100 and 200 can output the printing parameter used for controlling the driving of printer 1 by using the past inspection information of printing inspector WM0.

REFERENCE SIGNS LIST

1: printer, 51: acquisition section, 52: output section, 60: database, 90: board, 100, 200: printing parameter acquisition device, PA0: printing region, SA0: designation region, WM0: printing inspector

The invention claimed is:
1. A printing device comprising:
circuitry configured to:
acquire a printing condition for specifying a member to be used when solder is printed on a board;
output, from a database that stores a printing condition, a printing parameter used for controlling driving of a printer, and a reliability of the printing parameter including inspection information on a print state of the solder inspected by a printing inspector in association with each other, the printing parameter which is associated with the stored printing condition corresponding to the acquired printing condition of which the reliability is a predetermined level or more; and
drive the printer to print the solder on the board using the printing parameter, wherein
the inspection information includes deviation information in which a deviation with respect to a target value of at least one of a volume of the solder printed on the board, an area of the solder printed on the board, and a height of the solder printed on the board is collected for multiple printing regions in the board in a printing process of multiple boards, and
the circuitry is further configured to:
classify the deviation with respect to the target value into multiple classes for the at least one of the volume of the solder, the area of the solder, and the height of the solder, and
output frequency-relevant information obtained by aggregating frequencies of occurrence of the deviation information belonging to each of the classes.

2. The printing device according to claim 1,
wherein the inspection information includes the deviation information in which the deviation with respect to the target value for each of the volume of the solder, the area of the solder, and the height of the solder is collected for the multiple printing regions in the board in the printing process of the multiple boards, and
wherein the circuity is configured to classify the deviation with respect to the target value into the multiple classes for each of the volume of the solder, the area of the solder, and the height of the solder.

3. The printing device according to claim 1, wherein the frequency-relevant information is:
frequency distribution data in which a frequency of occurrence of the deviation information is recorded for each class, or
a frequency distribution or a relative frequency distribution created based on the frequency distribution data.

4. The printing device according to claim 1, wherein the circuitry is configured to:
acquire a designation region, which is a predetermined printing region among the multiple printing regions in the board, and
output the printing parameter and the frequency-relevant information based on the deviation information for the designation region.

5. The printing device according to claim 4, wherein the designation region is:
a printing region in which the print state is determined as bad by the printing inspector, or
a printing region designated in consideration of at least one of an area and a shape of the printing region.

6. The printing device according to claim 1, wherein the circuitry is configured to:
multiply a matching degree between the acquired printing condition and the stored printing by a coefficient representing weighting for each printing condition to determine a matching score that scores the matching degree between the acquired printing condition and the stored printing condition, and
determine that the higher a matching score, the more the acquired printing condition corresponds to the stored printing condition.

7. The printing device according to claim 6,
wherein the reliability of the printing parameter includes the matching score, and
wherein the circuitry is configured to output the printing parameter in descending order of the matching score.

8. The printing device according to claim 1,
wherein the reliability of the printing parameter includes a number of productions of board products produced using the printing parameter, and wherein the circuitry is configured to output the printing parameter in which the number of productions is a predetermined number or more.

9. The printing device according to claim 1,
wherein the reliability of the printing parameter includes a cycle time from an initiation of loading of the board by the printer to the printing of the solder on the board so that the board is capable of being unloaded from the printer, and
wherein the circuitry is configured to output the printing parameter in which the cycle time is a predetermined time or less.

10. The printing device according to claim 1,
wherein the reliability of the printing parameter includes a non-defective product rate, which is a ratio of non-defective products when multiple board products are produced by using the printing parameter, and
wherein the circuitry is configured to output the printing parameter having the non-defective product rate of a predetermined ratio or more.

11. The printing device according to claim 1,
wherein the reliability of the printing parameter includes the deviation with respect to the target value for the at least one of the volume of the solder, the area of the solder, and the height of the solder, and
wherein the circuitry is configured to output the printing parameter of which the deviation is a predetermined value or less.

12. The printing device according to claim 1, wherein when at least a part of the printing parameter included in a production program for driving the printer is changed, the circuitry is configured to store the printing condition, the changed part of the printing parameter, and a reliability of the changed part of the printing parameter in a newly created file in new association with each other in the database.

13. A printing device comprising:
circuitry configured to:
acquire a printing condition for specifying a member to be used when solder is printed on a board;
output, from a database that stores a printing condition, a printing parameter used for controlling driving of a printer, and a reliability of the printing parameter including inspection information on a print state of the solder inspected by a printing inspector in association with each other, the printing parameter and the reliability of the printing parameter including the inspection information which are associated with the stored printing condition corresponding to the acquired printing condition; and
drive the printer to print the solder on the board using the printing parameter, wherein
the inspection information includes deviation information in which a deviation with respect to a target value at least one of a volume of the solder printed on the board, an area of the solder printed on the board, and a height of the solder printed on the board is collected for multiple printing regions in the board in a printing process of multiple boards, and
the circuitry is further configured to:
classify the deviation with respect to the target value into multiple classes for the at least one of the volume of the solder, the area of the solder, and the height of the solder, and
output frequency-relevant information obtained by aggregating frequencies of occurrence of the deviation information belonging to each of the classes.

14. A printing method comprising:
acquiring a printing condition for specifying a member to be used when solder is printed on a board;
outputting, from a database that stores a printing condition, a printing parameter used for controlling driving of a printer, and a reliability of the printing parameter including inspection information on a print state of the solder inspected by a printing inspector in association with each other, the printing parameter which is associated with the stored printing condition corresponding to the acquired printing condition and of which the reliability is a predetermined level or more; and
driving the printer to print the solder on the board using the printing parameter, wherein
the inspection information includes deviation information in which a deviation with respect to a target value of at least one of a volume of the solder printed on the board, an area of the solder printed on the board, and a height of the solder printed on the board is collected for multiple printing regions in the board in a printing process of multiple boards, and
the method further comprises:
classifying the deviation with respect to the target value into multiple classes for the at least one of the volume of the solder, the area of the solder, and the height of the solder, and
outputting frequency-relevant information obtained by aggregating frequencies of occurrence of the deviation information belonging to each of the classes.

15. A printing method comprising:
acquiring a printing condition for specifying a member to be used when solder is printed on a board;
outputting, from a database that stores a printing condition, a printing parameter used for controlling driving of a printer, and a reliability of the printing parameter including inspection information on a print state of the solder inspected by a printing inspector in association with each other, the printing parameter and the reliability of the printing parameter including the inspection information which are associated with the stored printing condition corresponding to the acquired printing condition; and
driving the printer to print the solder on the board using the printing parameter, wherein
the inspection information includes deviation information in which a deviation with respect to a target value at least one of a volume of the solder printed on the board, an area of the solder printed on the board, and a height of the solder printed on the board is collected for multiple printing regions in the board in a printing process of multiple boards, and
the method further comprises:
classify the deviation with respect to the target value into multiple classes for the at least one of the volume of the solder, the area of the solder, and the height of the solder, and
output frequency-relevant information obtained by aggregating frequencies of occurrence of the deviation information belonging to each of the classes.

* * * * *